(12) United States Patent
Yamauchi et al.

(10) Patent No.: US 11,811,007 B2
(45) Date of Patent: Nov. 7, 2023

(54) METHOD FOR MANUFACTURING LIGHT EMITTING DEVICE

(71) Applicant: NICHIA CORPORATION, Anan (JP)

(72) Inventors: Shigeharu Yamauchi, Anan (JP); Kenta Niki, Tokushima (JP)

(73) Assignee: NICHIA CORPORATION, Anan (JP)

( * ) Notice: Subject to any disclaimer, the term of this patent is extended or adjusted under 35 U.S.C. 154(b) by 576 days.

(21) Appl. No.: 16/887,986

(22) Filed: May 29, 2020

(65) Prior Publication Data
US 2020/0381593 A1    Dec. 3, 2020

(30) Foreign Application Priority Data

May 31, 2019    (JP) .................................. 2019-102708

(51) Int. Cl.
*H01L 33/50*    (2010.01)
*H01L 33/00*    (2010.01)
*H01L 33/62*    (2010.01)

(52) U.S. Cl.
CPC ............ *H01L 33/50* (2013.01); *H01L 33/005* (2013.01); *H01L 33/62* (2013.01)

(58) Field of Classification Search
CPC combination set(s) only.
See application file for complete search history.

(56) References Cited

U.S. PATENT DOCUMENTS

| | | | |
|---|---|---|---|
| 9,794,991 B2 * | 10/2017 | Zoorob | ...................... F21K 9/00 |
| 10,629,569 B2 | 4/2020 | Yamauchi et al. | |
| 2010/0320928 A1 | 12/2010 | Kaihotsu et al. | |
| 2011/0037413 A1 * | 2/2011 | Negley | ...................... F21K 9/00 |
| | | | 362/231 |
| 2012/0038280 A1 | 2/2012 | Zoorob et al. | |
| 2016/0284950 A1 | 9/2016 | Tseng | |
| 2018/0024006 A1 | 1/2018 | Akagawa et al. | |
| 2020/0349878 A1 * | 11/2020 | Iversen | ............... G09G 3/2003 |

FOREIGN PATENT DOCUMENTS

| | | |
|---|---|---|
| JP | 2010218991 A | 9/2010 |
| JP | 2011040584 A | 2/2011 |
| JP | 2011146611 A | 7/2011 |
| JP | 2013120812 A | 6/2013 |
| JP | 2015195356 A | 11/2015 |
| JP | 2018022860 A | 2/2018 |

* cited by examiner

*Primary Examiner* — Ratisha Mehta
(74) *Attorney, Agent, or Firm* — Global IP Counselors, LLP

(57) ABSTRACT

A method for manufacturing a light emitting device includes preparing a light emitting device including: a package defining a recess; a first light source placed within the recess, and including a first light emitting element and a first wavelength conversion member; a second light source placed within the recess; and a second wavelength conversion member in contact with and covering the first light source and the second light source, the first light source and the second light source being configured to emit light independently of each other. The method further includes: emitting light simultaneously from the first light source and the second light source to obtain mixed light for which light from the first light source, light from the second light source, and light from the second wavelength conversion member are mixed; determining a chromaticity of the mixed light; and binning the mixed light based on the chromaticity.

17 Claims, 6 Drawing Sheets

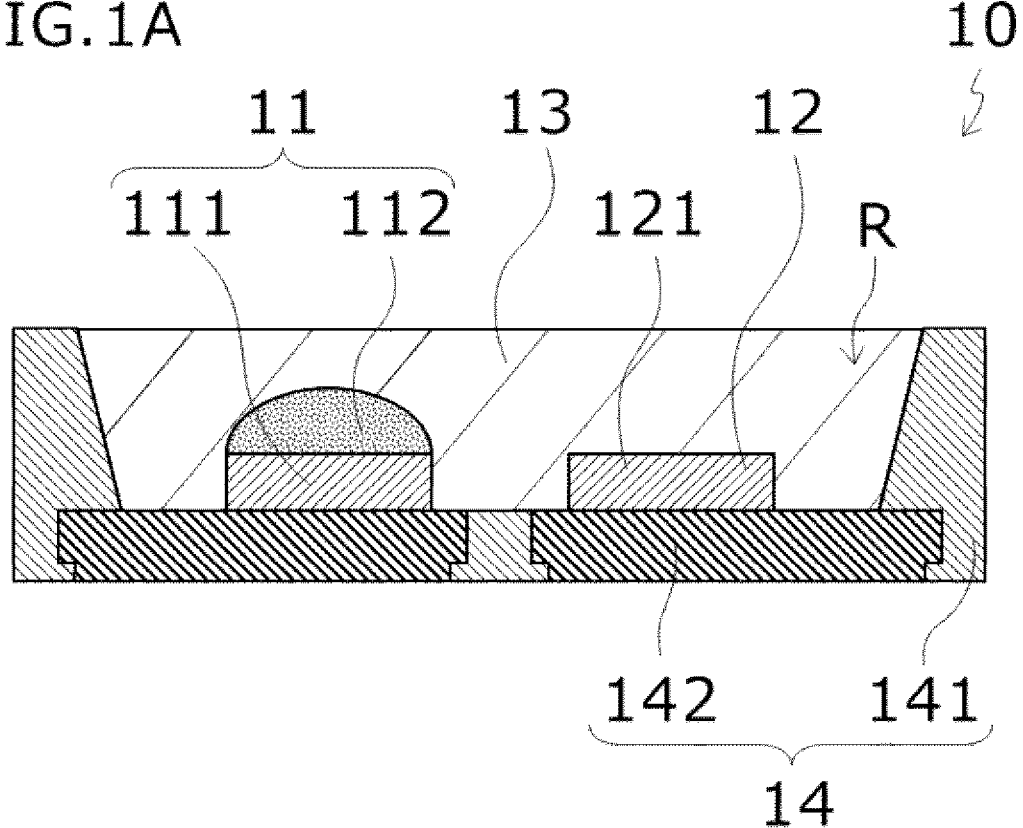

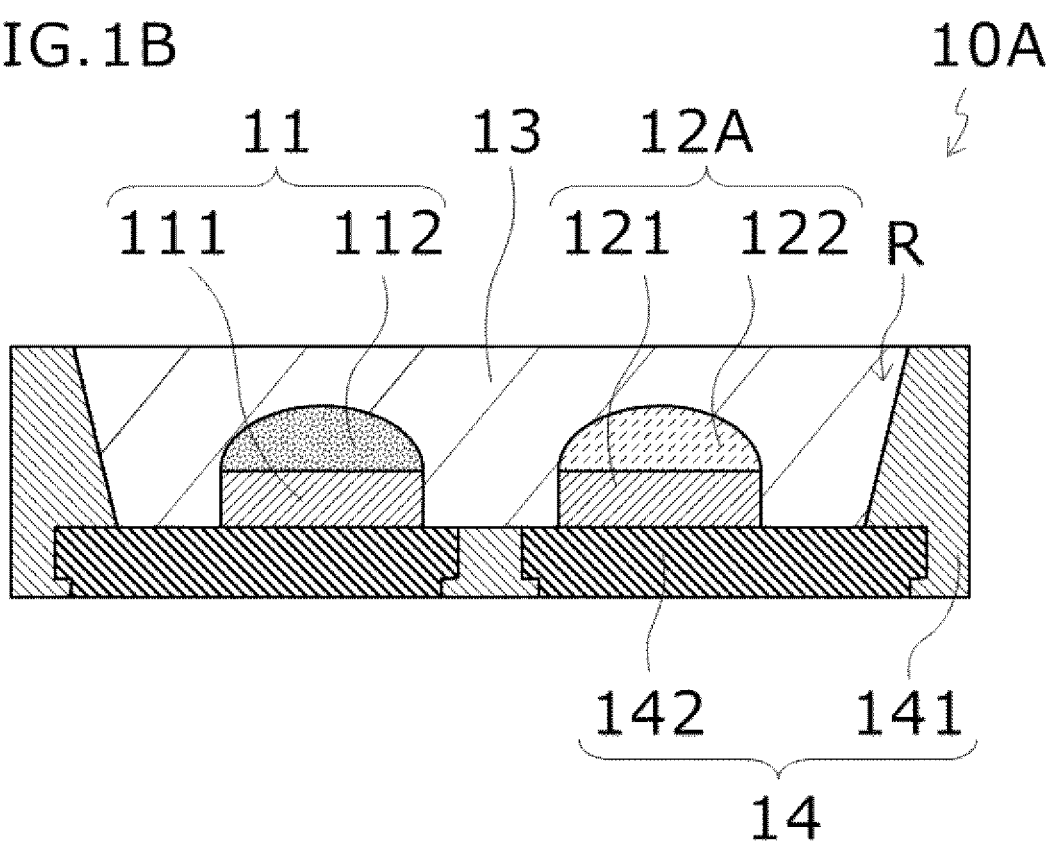

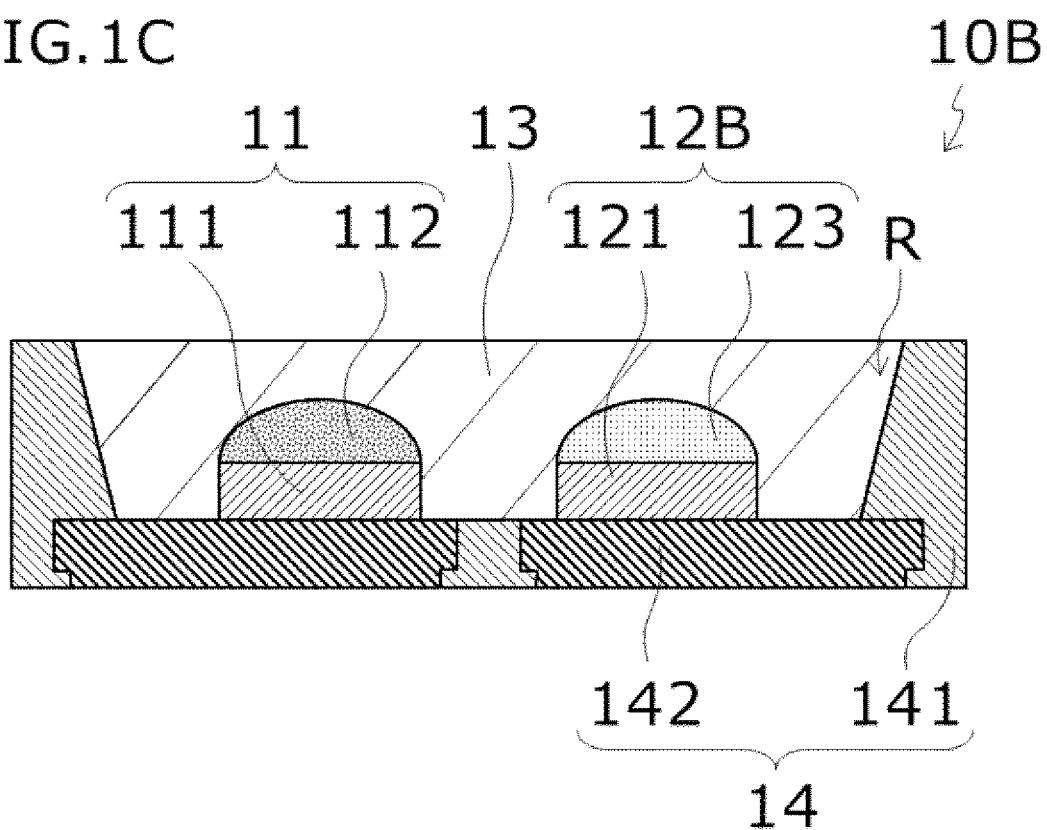

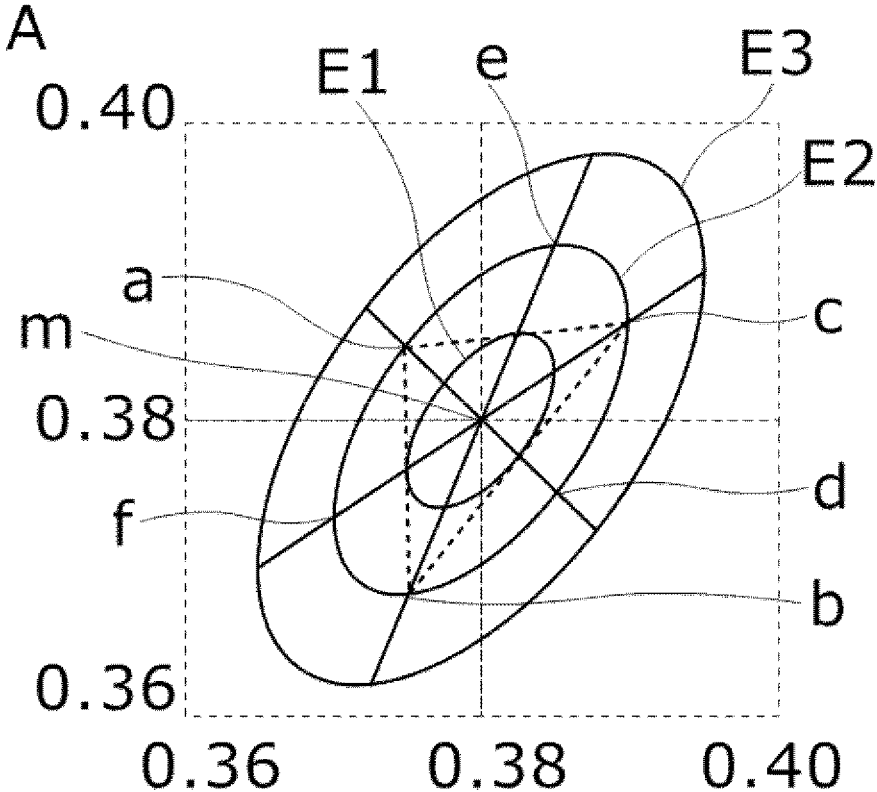

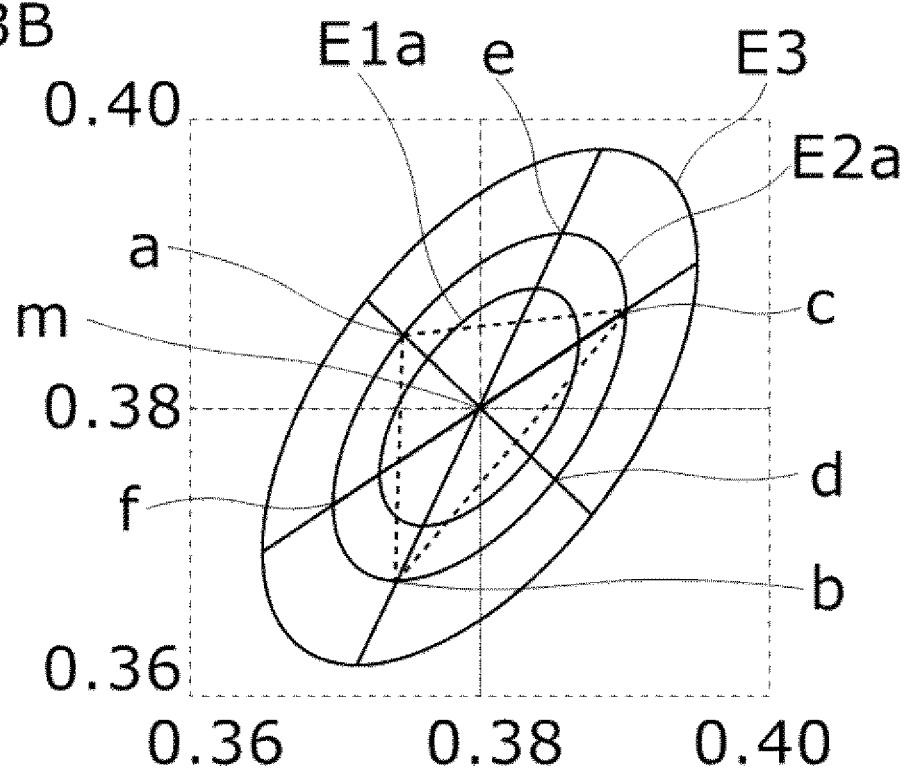

METHOD FOR MANUFACTURING LIGHT EMITTING DEVICE

CROSS-REFERENCE TO RELATED APPLICATIONS

This application claims priority to Japanese Patent Application No. 2019-102708 filed on May 31, 2019. The entire disclosure of Japanese Patent Application No. 2019-102708 is hereby incorporated herein by reference.

TECHNICAL FIELD

The present invention relates to a method for manufacturing a light emitting device.

BACKGROUND ART

As an LED (Light Emitting Diode) for lighting, light emitting devices are known for which color tuning is possible by providing a plurality of light sources that can emit light of different color temperatures.

For example, in the case of a light emitting device comprising a light source of color temperature 2000K (warm white), and a light source of color temperature 5000K (cool white), light of color temperatures between 2000K to 5000K can be emitted by adjusting the current applied to each light source (see, Japanese Laid-Open Patent Publication No. 2013-120812).

SUMMARY

In the case of this kind of light emitting device, with the example described above, binning is done with only a light source of color temperature 2000K made to emit light, and then binning is done with only a light source of color temperature 5000K made to emit light. In a case when one light emitting device comprises two or more light sources, and each is capable of emitting light individually, performing binning by each of the respective color temperatures becomes one cause of a decrease in yield.

The present disclosure includes the following configuration.

A method for manufacturing a light emitting device includes preparing a light emitting device including: a package defining a recess; a first light source placed within the recess, and including a first light emitting element and a first wavelength conversion member; a second light source placed within the recess; and a second wavelength conversion member in contact with and covering the first light source and the second light source, the first light source and the second light source being configured to emit light independently of each other. The method further includes: emitting light simultaneously from the first light source and the second light source to obtain mixed light for which light from the first light source, light from the second light source, and light from the second wavelength conversion member are mixed; determining a chromaticity of the mixed light; and binning the mixed light based on the chromaticity of the mixed light.

From the above, it is possible to improve the yield of a light emitting device capable of color tuning.

BRIEF DESCRIPTION OF THE DRAWINGS

FIG. 1A is a schematic cross section view showing an example of a light emitting device obtained using a method for manufacturing a light emitting device of the present embodiment.

FIG. 1B is a schematic cross section view showing an example of the light emitting device obtained using the method for manufacturing a light emitting device of the present embodiment.

FIG. 1C is a schematic cross section view showing an example of the light emitting device obtained using the method for manufacturing a light emitting device of the present embodiment.

FIG. 3A is a graph showing the chromaticity range within a 7-step MacAdam ellipse on a CIE 1931 standard chromaticity diagram.

FIG. 3B is a graph showing the chromaticity range within a 7-step MacAdam ellipse on a CIE 1931 standard chromaticity diagram.

DETAILED DESCRIPTION OF EMBODIMENTS

Figure 2:
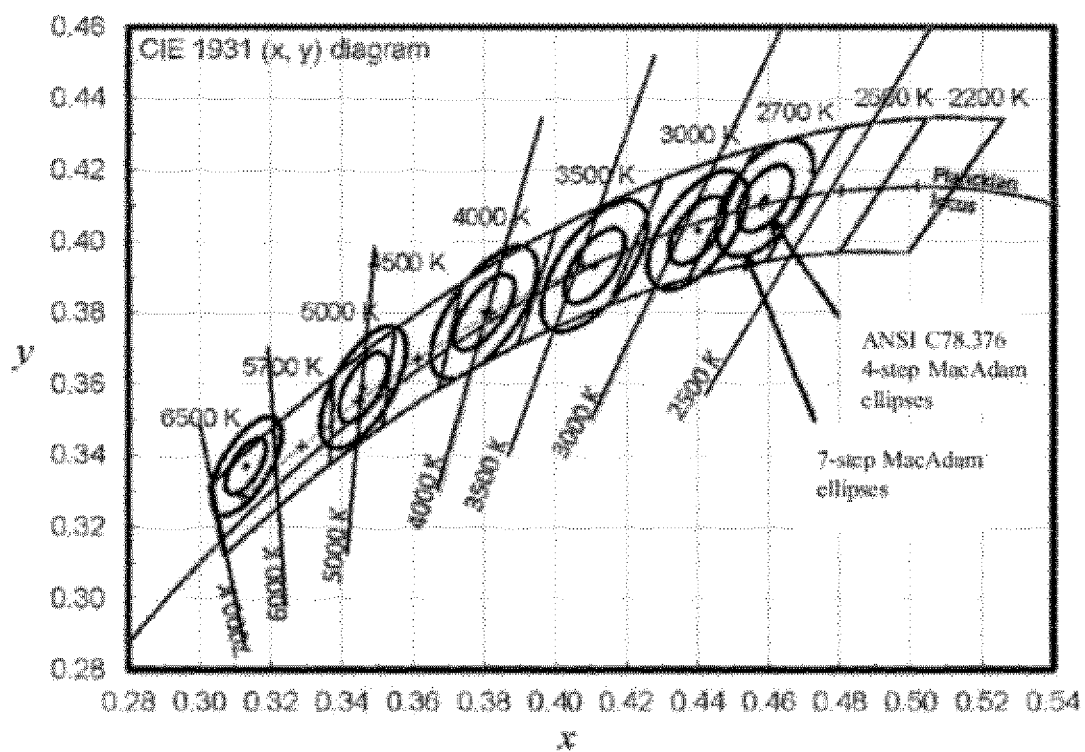
FIG. 2 is a drawing showing the ANSI chromaticity range and a 7-step MacAdam ellipse on a CIE 1931 (x, y) chromaticity diagram.

Modes for carrying out the present invention are explained hereafter while referring to drawings. However, the embodiments shown hereafter show examples of the method for manufacturing a light emitting device to put into exemplified form of the technical concept of the present disclosure, and the present disclosure is not limited to the method for manufacturing a light emitting device as described below.

The method for manufacturing a light emitting device of the present embodiment includes: a step for preparing a light emitting device comprising a first light source and a second light source capable of emitting light individually and independently of each other; a mixed light emitting step for emitting mixed light by having light emitted by both the first light source and the second light source; and a mixed light binning step for binning by determining the chromaticity of the mixed light.

<Step for Preparing a Light Emitting Device>

FIG. 1A shows an example of a light emitting device 10. The light emitting device 10 includes: a package 14 defining a recess R; and a first light source 11 and a second light source 12 placed within the recess R.

The first light source 11 includes a first light emitting element 111 and a first wavelength conversion member 112. The first wavelength conversion member 112 is a light-transmissive member that includes a wavelength conversion substance such as a phosphor that absorbs light from the first light emitting element 111, and converts the light from the first light emitting element 111 to light of a different wavelength. The second light source 12 includes a second light emitting element 121.

The light emitting device 10 further comprises a second wavelength conversion member 13 that covers light from the first light source 11 and light from the second light source 12. The second wavelength conversion member 13 contacts the first light source 11 and the second light source 12. The second wavelength conversion member 13 is a light-transmissive member including a wavelength conversion substance such as a phosphor that absorbs light from the first light emitting element 111 and light from the second light emitting element 121, and converts light from the first light emitting element 111 and light from the second light emitting element 121 to light of different wavelengths.

The first light source 11 and the second light source 12 are capable of emitting light individually and independently of each other. Specifically, it is possible to have light emitted by only one of the first light source 11 and the second light source 12 according to the purpose or application. Alternatively, it is possible to have light emitted simultaneously by both the first light source 11 and the second light source 12.

When having light emitted by only the first light source 11, in other words, when only the first light emitting element 111 is energized, a first light is emitted from the light emitting device 10 in which the light from the first light emitting element 111, the light from the first wavelength conversion member 112, and the light from the second wavelength conversion member 13 are mixed. The color temperature of the first light can be 2200K to 3000K, for example.

When light is emitted only by the second light source 12, in other words, when only the second light emitting element 121 is energized, a second light is emitted from the light emitting device 10 in the light from the second light emitting element 121, and the light from the second wavelength conversion member 13 are mixed. The color temperature of the second light can be 4000K to 6500K, for example.

When the positions of the first light source 11 and the second light source 12 are close to each other, when light is emitted only by the second light source 12, if light is irradiated on the first wavelength conversion member 112, there are cases when light from the first wavelength conversion member 112 is also included in the second light. Also, each of the first light and the second light is light in which light from the light emitting element(s) and light from the wavelength conversion substance are mixed, but these lights are referred as the first light and the second light. Light obtained by having light emitted by both the first light source and the second light source is called mixed light (third light).

The color temperature of the first light and the color temperature of the second light can have a difference of 600K or greater. Preferably, the color temperature of the first light and the color temperature of the second light can have a difference of 1000K or greater. In this way, the greater the difference in the color temperatures, the greater the effect of suppressing a decrease in yield.

Also, when the color temperature of the second light is a white color of 5000K or greater, variation in chromaticity increases easily. This is because there are few components of light in the second light caused by the wavelength conversion substance included in the second wavelength conversion member 13, and because it is difficult to precisely control the amount of the wavelength conversion substance of a small amount. For that reason, in the step for manufacturing the light emitting device capable of color tuning that includes the second light with this kind of high color temperature, by including a mixed light binning step that bins the mixed light (third light) obtained by having light emitted simultaneously by the first light source 11 and the second light source 12, it is possible to suppress a decrease in yield.

When light is emitted by both the first light source 11 and the second light source 12, the mixed light (third light) is emitted from the light emitting device 10 in which light from the first light source 11 (light from the first light emitting element 111 and light from the first wavelength conversion member 112), light from the second light source 12 (light from the second light emitting element 121), and light from the second wavelength conversion member 13 are mixed. The color temperature of the third light can be 2700K to 5700K, for example.

FIG. 1B and FIG. 1C show modification examples of the light emitting device. A light emitting device 10A shown in FIG. 1B has the same configuration as the light emitting device 10 in FIG. 1A other than that a second light source 12A comprises the second light emitting element 121 and a light-transmissive member 122 placed on the second light emitting element 121. The light-transmissive member 122 is a light-transmissive member that is substantially free of phosphor. The light-transmissive member 122 may also contain a diffusing agent, etc. such as $SiO_2$, $TiO_2$. By using such a configuration, it is easier to extract the light from the second light source 12A, in other words, the light from the second light emitting element 121 to the outside. By using such a configuration, when light is emitted only by the second light source 12A, light emission at chromaticity of a higher color temperature is possible. When the second light source 12A includes the light-transmissive member 122, the color temperature of the second light can be 5000K to 7500K, for example, and the color temperature of the third light can be 2700K to 6500K, for example.

A light emitting device 10B shown in FIG. 1C has the same configuration as that of the light emitting device 10 shown in FIG. 1A other than that the second light source 12B comprises the second light emitting element 121, and a third wavelength conversion member 123 placed on the second light emitting element 121. The third wavelength conversion member 123 includes the wavelength conversion substance such as a phosphor, etc. The color temperature of the second light in this example can be 5000K to 7500K, for example, and the color temperature of the third light can be 2700K to 6500K. As the material of the third wavelength conversion member 123, it is possible to use the same material as that of the first wavelength conversion member 112.

With FIG. 1A to FIG. 1C, the package 14 is an example of a resin package for which a resin body 141 and an electrically conductive member 142 are integrally molded. However, the present disclosure is not limited to this configuration, and it is also possible to use a package, etc., for which a recess is formed by providing a frame on a plate shaped substrate, such as a COB (Chip On Board) type package.

For the first light emitting element 111 and the second light emitting element 121, it is possible to use a semiconductor light emitting element capable of emitting ultraviolet to blue light, for example. For the first light emitting element 111 and the second light emitting element 121, it is possible to use light emitting elements that use a nitride semiconductor ($In_xAl_yGa_{1-x-y}N$, $0 \leq X$, $0 \leq Y$, $X+Y \leq 1$), for example. Also, the first light emitting element 111 and the second light emitting element 121 may have the same wavelength, or may have different wavelengths.

The first wavelength conversion member 112 and the second wavelength conversion member 13 are light-transmissive members that include wavelength conversion substance(s) such as phosphor(s), etc., and light-transmissive resin material(s). Examples of the light-transmissive resin material include epoxy resin, silicone resin, etc.

Also, as the wavelength conversion substance included in the first wavelength conversion member 112, for example, examples include (Sr, Ca)$AlSiN_3$: Eu, $K_2$(Si, Ti, Ge)$F_6$: Mn, etc. Also, as the wavelength conversion substance included in the second wavelength conversion member 13, it is preferable to use (Y, Lu, Gd)$_3$(Al, Ga)$_5O_{12}$: Ce, for example, and it is further possible to list by example an item for which (Y, Lu, Gd)$_3$(Al, Ga)$_5O_{12}$: Ce and (Sr, Ca)$AlSiN_3$: Eu are mixed. As the wavelength conversion substance, in addition to the abovementioned items, it is also possible to use (Ca, Sr, Ba)$_5$(PO$_4$)$_3$(Cl, Br): Eu, (Sr, Ca, Ba)$_4$Al$_{14}$O$_{25}$: Eu, (Ca, Sr, Ba)$_8$MgSi$_4$O$_{16}$(F, Cl, Br)$_2$: Eu, (Sr, Ca)$AlSiN_3$: Eu, 3.5MgO·0.5MgF$_2$·GeO$_2$: Mn, (x−s)MgO·(s/2)Sc$_2$O$_3$·yMgF$_2$·uCaF$_2$·(1−t)GeO$_2$·(t/2)M$'_2$O$_3$: zMn, $Ca_3Sc_2Si_3O_{12}$: Ce, $CaSc_2O_4$: Ce, $(La, Y)_3Si_6N_{11}$: Ce, $(Ca, Sr, Ba)_3Si_6O_9N_4$: Eu, $(Ca, Sr, Ba)_3Si_6O_{12}N_2$: Eu, $(Ba, Sr, Ca)Si_2O_2N_2$: Eu, $(Ca, Sr, Ba)_2Si_5N_8$: Eu, $(Ca, Sr, Ba)S$: Eu, $(Ba, Sr, Ca)Ga_2S_4$: Eu, etc. Furthermore, it is also possible to use quantum dots, etc.

<Step for Emitting Light from Light Emitting Device>

Next, light is emitted by both the first light source 11 and the second light source 12, and mixed light (third light) is emitted. It is possible to apply the same current, for example, to the first light source 11 and the second light source 12. Alternatively, it is possible to make the current applied to the first light source 11 and the current applied to the second light source 12 be different.

The mixed light (third light) obtained by having light emitted simultaneously by both the first light source 11 and the second light source 12 is light that is emitted by applying prescribed currents of current values set in advance. The current values set in advance can be set to achieve a target chromaticity set with respect to a desired target color temperature.

Having light emitted simultaneously by both the first light source 11 and the second light source 12 includes a case of having the light emission start timings be the same, and a case of having the light emission start timings be shifted. The case of having the light emission start timings be shifted can be, for example, when the response speed of the wavelength conversion substance included in the first wavelength conversion member 112 included in the first light source 11 is slow, first having light emitted by the first light source 11, and then having light emitted by the second light source 12 in a state with the first light source 11 having emitted light, to obtain the mixed light (third light). This makes it possible to perform binning stably and precisely even in a case when the wavelength conversion substance with a slow response speed is included. An example of such a wavelength conversion substance with a slow response speed is $K_2(Si, Ti, Ge)F_6$:Mn.

Also, for example, when the substance is susceptible to effects such as a decrease in luminous efficiency when the temperature of the wavelength conversion substance included in the first wavelength conversion member 112 included in the first light source 11 is high, it is also possible, after first having light emitted by the second light source 12, to have light emitted by the first light source 11 in a state with light emitted by the second light source 12, to obtain the mixed light (third light). This makes it possible to perform binning stably and precisely. An example of such a wavelength conversion substance that is susceptible to the effects of temperature changes is $(Sr, Ca)AlSiN_3$:Eu.

In this way, by shifting the light emission start timings, in other words, by shifting the timings of energization, it is possible to perform binning stably and precisely. Shifting of the light emission start timings can be from 1 msec to 10 msec, for example.

<Step for Determining Chromaticity of Light, and Binning>

The chromaticity of the mixed light (third light) obtained by currents of preset current values being applied is determined, and the light emitting device 10 is binned based on the determination result. For the chromaticity determination, as chromaticity for lighting, for example, there are standards of the chromaticity range set by JIS, ANSI, etc., and it is preferable that the white type light obtained from a lighting device be within this range.

For chromaticity binning, binning is preferably done within the chromaticity range set with respect to a prescribed color temperature in terms of chromaticity. For example, it is possible to do binning using a chromaticity ellipse set to a quadrilateral (bin) with respect to the prescribed color temperature on a chromaticity diagram. Preferably, a step is provided for performing binning using a MacAdam ellipse set with respect to the prescribed color temperature on the chromaticity diagram.

For chromaticity binning, it is preferable to do binning to be within a 7-step MacAdam ellipse set with respect to the prescribed color temperature on the chromaticity diagram. More preferably, binning is done to be within a 5-step MacAdam ellipse, and even more preferably, binning is done to be within a 3-step MacAdam ellipse. Depending on the application, etc., it is particularly preferable to do binning to be within a 2.5-step or within a 2-step MacAdam ellipse.

FIG. 2 is a drawing showing the ANSI chromaticity range and 7-step MacAdam ellipses on the CIE 1931 (x, y) chromaticity diagram. FIG. 3A and FIG. 3B show examples of an ellipse E3 showing the chromaticity range that approximately matches a 7-step MacAdam ellipse, and the ellipse of color temperature 4000K in FIG. 2. With FIG. 3A and FIG. 3B, E2 and E1 in FIG. 3A, and E2a and E1a in FIG. 3B are further shown as two ellipses inside the 7-step MacAdam ellipse. For binning of the mixed light, it is possible to perform binning to be included within this kind of MacAdam ellipse range.

Furthermore, it is possible to perform binning using divided regions divided by the line passing through the center of the MacAdam ellipses. The number of divisions can be two divisions, three divisions, four divisions, six divisions, etc. With FIG. 3A and FIG. 3B, shown are examples comprising divided regions that are divided into six regions by three straight lines passing through the center of the MacAdam ellipses.

With FIG. 3A, three vertices (a, b, c) of a triangle which circumscribes the ellipse E1 approximating a 3-step MacAdam ellipse and which inscribes the ellipse E2 approximating a 5-step MacAdam ellipse, and points (d, e, f) for which the straight lines connecting each vertex (a, b, c) and the center of the ellipse intersect the ellipse E2 are stipulated. Then, six divisions using three straight lines ad, be, cf, and straight lines extending from those can be made.

Furthermore, when making six divisions, it is also possible to set an ellipse of a size that intersects with each of the three straight lines ad, be, cf described above at two points. For example, as shown in FIG. 3B, when stipulating the ellipse E1a that approximately matches the 3-step MacAdam ellipse in the example described above, the straight lines ad, be, cf respectively intersect with the ellipse E1a at two points.

When making six divisions in the MacAdam ellipse as described above, for example, it is possible to further reduce variations in a lighting device such as a lamp by combining light emitting devices in the chromaticity regions at linearly symmetrical positions with respect to one of the straight lines ad, be, cf.

By binning the mixed light (third light) obtained by having light emitted simultaneously by both the first light source 11 and the second light source 12 in this way, it is possible to improve the yield.

Furthermore, in addition to binning of the third light, it is also possible to perform a first light binning step and/or a second light binning step.

For example, it is possible to comprise a first light emitting step that has light emitted by only the first light source 11 to emit the first light. As described above, the color temperature of the first light is 2200K to 3000K, and is a lower color temperature than the color temperature of the mixed light (third light) on the chromaticity diagram. It is also possible to perform a first light binning step for performing binning using the MacAdam ellipse set with respect to this color temperature. In this case, with the first light binning step, it is possible to perform binning using the same size MacAdam ellipse steps as the MacAdam ellipse step used with the mixed light binning step. Alternatively, with the first light binning step, it is possible to perform binning using a larger MacAdam ellipse step than the Macadam ellipse step used with the mixed light binning step. For example, it is possible to perform binning using the 3-step MacAdam ellipse in the mixed light binning step, and to perform binning using the 3-step MacAdam ellipse, or the larger 5-step or 7-step in the first light binning step. By using the equivalent or more relaxed determination criteria as the mixed light binning for the first light binning in this way, it is possible to suppress a decrease in yield, and also suppress a variation of the first light in the light emitting device.

Similarly, it is possible to comprise a second light emitting step that has light emitted by only the second light source 12 to emit the second light. As described above, the color temperature of the second light is 4000K to 6500K, and is a higher color temperature than the color temperature of the mixed light (third light) on the chromaticity diagram. It is also possible to perform a second light binning step that performs binning using the MacAdam ellipse set with respect to this color temperature. In this case, with the second light binning step, it is possible to perform binning using the same size MacAdam ellipse step as the MacAdam ellipse step used with the mixed light binning step. Alternatively, with the second light binning step, it is possible to perform binning using a larger MacAdam ellipse step than the MacAdam ellipse step used with the mixed light binning step. For example, it is possible to perform binning using the 3-step MacAdam ellipse in the mixed light binning step, and to perform binning using the 5-step or 7-step that are larger than the 3-step MacAdam ellipse in the second light binning step. By using the equivalent or more relaxed determination criteria as the mixed light binning for the second light binning in this way, it is possible to suppress a decrease in yield, and also suppress a variation of the second light in the light emitting device.

What is claimed is:
1. A method for manufacturing a light emitting device comprising:
  preparing a light emitting device including:
    a package defining a recess;
    a first light source placed within the recess, and including a first light emitting element and a first wavelength conversion member;
    a second light source placed within the recess; and
    a second wavelength conversion member in contact with and covering the first light source and the second light source, the first light source and the second light source being configured to emit light independently of each other;
  emitting light simultaneously from the first light source and the second light source to obtain mixed light for which light from the first light source, light from the second light source, and light from the second wavelength conversion member are mixed;
  determining a chromaticity of the mixed light; and
  binning the mixed light based on the chromaticity of the mixed light.
2. The method for manufacturing a light emitting device according to claim 1, wherein
  the binning of the mixed light includes binning the mixed light using a MacAdam ellipse set with respect to a prescribed color temperature of the mixed light on a chromaticity diagram.
3. The method for manufacturing a light emitting device according to claim 2, wherein
  the binning of the mixed light includes binning the mixed light in one of divided regions of the MacAdam ellipse divided by a line passing through a center of the MacAdam ellipse.
4. The method for manufacturing a light emitting device according to claim 3, wherein
  the binning of the mixed light includes binning the mixed light in one of six divided regions of the MacAdam ellipse divided using lines passing through the center of the MacAdam ellipse.
5. The method for manufacturing a light emitting device according to claim 3, wherein
  the binning of the mixed light includes binning the mixed light in one of four divided regions of the MacAdam ellipse divided using lines passing through the center of the MacAdam ellipse.
6. The method for manufacturing a light emitting device according to claim 2, wherein
  the binning of the mixed light includes binning the mixed light using a region of the MacAdam ellipse within a 7-step range.
7. The method for manufacturing a light emitting device according to claim 2, wherein
  the binning of the mixed light includes binning the mixed light using a region of the MacAdam ellipse within a 5-step range.
8. The method for manufacturing a light emitting device according to claim 2, wherein
  the binning of the mixed light includes binning the mixed light using a region of the MacAdam ellipse within a 3-step range.
9. The method for manufacturing a light emitting device according to claim 2, further comprising:
  emitting light only from the first light source to emit a first light;
  determining a chromaticity of the first light; and
  binning the first light based on the chromaticity of the first light using a MacAdam ellipse step of the same size or larger than a MacAdam ellipse step used in the binning of the mixed light, the MacAdam ellipse used in the binning of the first light being set with respect to a color temperature that is lower than the prescribed color temperature of the mixed light on the chromaticity diagram.
10. The method for manufacturing a light emitting device according to claim 2, further comprising:
  emitting light only from the second light source to emit a second light;
  determining a chromaticity of the second light; and
  binning the second light based on the chromaticity of the second light using a MacAdam ellipse step of the same size or larger than a MacAdam ellipse step used in the binning of the mixed light, the MacAdam ellipse used in the binning of the second light being set with respect to a color temperature that is higher than the prescribed color temperature of the mixed light on the chromaticity diagram.
11. The method for manufacturing a light emitting device according to claim 1, wherein
  the preparing of the light emitting device includes providing the first light source, the second light source and the second wavelength conversion member so that a difference between a color temperature of a first light obtained by emitting light only from the first light source and a color temperature of a second light obtained by emitting light only from the second light source is 600K or greater.

12. The method for manufacturing a light emitting device according to claim 1, wherein
the preparing of the light emitting device includes providing the first light source and the second wavelength conversion member so that a first light obtained by emitting light only from the first light source has a color temperature of 2200K to 3000K.

13. The method for manufacturing a light emitting device according to claim 1, wherein
the preparing of the light emitting device includes providing the second light source and the second wavelength conversion member so that a second light obtained by emitting light only from the second light source has a color temperature of 4000K to 6500K.

14. The method for manufacturing a light emitting device according to claim 1, wherein
the emitting of the light simultaneously from the first light source and the second light source includes obtaining the mixed light by first emitting the light only from first light source, and then emitting the light from the second light source while the light is emitted from the first light source.

15. The method for manufacturing a light emitting device according to claim 1, wherein
the emitting of the light simultaneously from the first light source and the second light source includes obtaining the mixed light by first emitting the light only from the second light source, and then emitting the light from the first light source while the light is emitted from the second light source.

16. The method for manufacturing a light emitting device according to claim 1, wherein
the preparing of the light emitting device includes providing the first light source and the second light source so that a color temperature of a first light obtained by emitting light only from the first light source is different from a color temperature of a second light obtained by emitting light only from the second light source.

17. The method for manufacturing a light emitting device according to claim 1, wherein
the preparing of the light emitting device includes preparing the light emitting device further including a pair of conductive members spaced apart from each other, the first light source and the second light source being respectively connected to the conductive members so that current is applied to the first light source and the second light source independently.

* * * * *